(12) United States Patent  (10) Patent No.: US 6,704,226 B2
Lee  (45) Date of Patent: Mar. 9, 2004

(54) SEMICONDUCTOR MEMORY DEVICE HAVING ROW REPAIR CIRCUITRY

(75) Inventor: Jung Seop Lee, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/035,194

(22) Filed: Jan. 4, 2002

(65) Prior Publication Data

US 2002/0167850 A1 Nov. 14, 2002

(30) Foreign Application Priority Data

May 9, 2001 (KR) ........................................ 2001-25144

(51) Int. Cl.[7] ................................................ G11C 7/00
(52) U.S. Cl. .................. 365/200; 365/201; 365/230.06; 371/10.2; 371/10.3
(58) Field of Search ................................ 365/200, 201, 365/230.06; 371/10.2, 10.3

(56) References Cited

U.S. PATENT DOCUMENTS

| 5,337,277 A | 8/1994 | Jang | 365/200 |
|---|---|---|---|
| 5,355,339 A | 10/1994 | Oh et al. | 365/200 |
| 5,359,560 A | * 10/1994 | Suh et al. | 365/200 |
| 5,416,740 A | 5/1995 | Fujita et al. | 365/200 |
| 5,528,539 A | 6/1996 | Ong et al. | 365/200 |
| 5,953,264 A | * 9/1999 | Hirano et al. | 365/200 |
| 5,963,489 A | 10/1999 | Kirihata et al. | 365/200 |
| 6,404,683 B1 | * 6/2002 | Yumoto | 365/200 |

FOREIGN PATENT DOCUMENTS

| JP | 4-346000 | 12/1992 |
|---|---|---|
| JP | 6-76594 | 3/1994 |
| JP | 9-063295 | 3/1997 |
| JP | 10-125093 | 5/1998 |
| JP | 10-172296 | 6/1998 |
| JP | 11-121627 | 4/1999 |
| JP | 11-297955 | 10/1999 |
| KR | 0015041 | 12/1995 |

* cited by examiner

Primary Examiner—Connie C. Yoha
(74) Attorney, Agent, or Firm—Pillsbury Winthrop LLP

(57) ABSTRACT

Our semiconductor memory device has row repair circuitry by which defective wordlines are substituted with redundant wordlines regardless of locations of cell array blocks, the redundant wordlines being divisionally arranged in memory blocks with the same number. The semiconductor memory device has a plurality of memory blocks each including the predetermined number of redundant wordlines, a plurality of row repair fuse boxes being divisionally arranged with the same number respective in the memory blocks, the number of the row repair fuse boxes being identical to the number of the redundant wordlines, and repair means to replace defective wordlines with the redundant wordlines.

12 Claims, 11 Drawing Sheets

| MB1 | | ROW CONTROL LOGIC | | MB3 |
|---|---|---|---|---|
| CCL1 | | | | CCL3 |
| PBL | | | | PBL |
| CCL0 | | | | CCL2 |
| MB0 | | ROW CONTROL LOGIC | | MB2 |

Fig.1 (Prior Art)

SEMICONDUCTOR MEMORY DEVICE HAVING ROW REPAIR CIRCUITRY

This application relies for priority upon Korean Patent Application No. 2001-25144, filed on May 9, 2001, the contents of which are herein incorporated by reference in their entirety.

BACKGROUND

1. Field of Invention

The inventions disclosed herein generally relate to a semiconductor memory device having a capacity of redundancy. More particularly, they relate to a semiconductor memory device having row repair circuitry in which defective wordlines are substituted with redundant wordlines regardless of locations of memory blocks. A predetermined number of the redundant wordlines is arranged in each memory block.

2. General Background and Related Art

It is usual that various kinds of defects are generated throughout a manufacturing process for a semiconductor memory device (e.g., a DRAM), thereby causing the memory device to malfunction and reducing the yield of its manufacturing process. Even one defect over a cell array in the semiconductor memory device may easily interrupt normal operations such as data read-out and write-in. For this reason, it is known to substitute defective memory cells with additionally prepared memory cells (i.e., redundant or spare memory cells), thereby increasing the yield of manufacture and reliability of the memory device. When one or more defective memory cells are detected by a test operation, the defective memory cells are substituted with the redundant memory cells that are arranged in the unit of row or column in a memory cell array of the memory device, thereby allowing the memory device to be used even though it has some defective cells.

FIG. 1 is a schematic representation of a DRAM. Consider a conventional 64M (64 megabits; $M=2^{20}$) DRAM constructed of four memory banks MB0, MB1, MB2 and MB3. Each memory bank has a storage capacity of 16M and an associated peripheral block PBL in which input/output pads are arranged and which includes input/output buffers and multiplexers assigned to the input/output pads. The peripheral block PBL where pads for address and control signals are positioned includes control signal buffers and address buffers being coupled to their corresponding pads, and further a control logic unit and a command state machine. Column control logic blocks CCL0~CCL3 each assigned to their corresponding memory banks have Y-decoders (or column decoders), drivers and data bus sense amplifiers to write data in memory cells or to read data from memory cells. Row control logic blocks assigned to their corresponding memory banks and which include X-decoders (or row decoders) and logic circuits for driving wordlines.

Each memory block has the predetermined number of redundant wordlines assigned thereto exclusively. According to the configurations of redundancy in this manner, since the predetermined number of redundant wordlines restricts defective wordlines yet repairable, the device shown in FIG. 1 may have a limitation to enhance the efficiency of repairing the defective wordlines (or memory cells) and to increase an extension facility of repairing. For instance, when the number of defective memory cells is greater than that of redundant wordlines in the memory bank MB1, it is impossible to repair the defective wordlines in excess of the capacity of the redundant wordlines therein.

SUMMARY

Among the various inventions described in this patent document, there is described a semiconductor memory device capable of enhancing the efficiency of repairing defective memory cells. There is also described a semiconductor memory device capable of repairing defective wordlines regardless of locations of defective wordlines.

There is provided a semiconductor memory device having a row repair function, including a plurality of memory blocks each having a predetermined number of redundant wordlines, a plurality of row repair fuse boxes arranged so that the same number are associated with each memory block, the number of the fuse boxes being identical to that of the redundant wordlines, and repair means to replace defective wordlines with the redundant wordlines. The redundant wordlines corresponds to the row repair fuse boxes each by each.

The inventions claimed will be better understood from the following detailed description of a presently preferred exemplary embodiment, described with reference to the accompanying drawings, and the scope of which will be set forth in the appended claims.

BRIEF DESCRIPTION OF THE DRAWINGS

A more complete appreciation of the present invention, and many of the attendant advantages thereof, will become readily apparent by reviewing the following detailed description in conjunction with the accompanying drawings in which like reference symbols indicate the same or similar components, wherein:

FIG. 1 is a block diagram illustrating architecture of a general 64M synchronous DRAM;

DETAILED DESCRIPTION

It should be understood that the description of the preferred embodiment is merely illustrative and it should not be taken in a limiting sense. In the following detailed description, several specific details are set forth in order to provide a thorough understanding of the present invention. It will be obvious, however, to one skilled in the art that the present invention may be practiced without these specific details.

An embodiment of the invention explained hereinafter is provided to a bank among a plurality of memory banks (e.g., four banks) arranged in a semiconductor memory device. Of course the inventions are not limited to devices having four banks. This is merely an example. Each practical circuit feature in the memory bank is the same but a address coding for bank selection.

Figure 2:
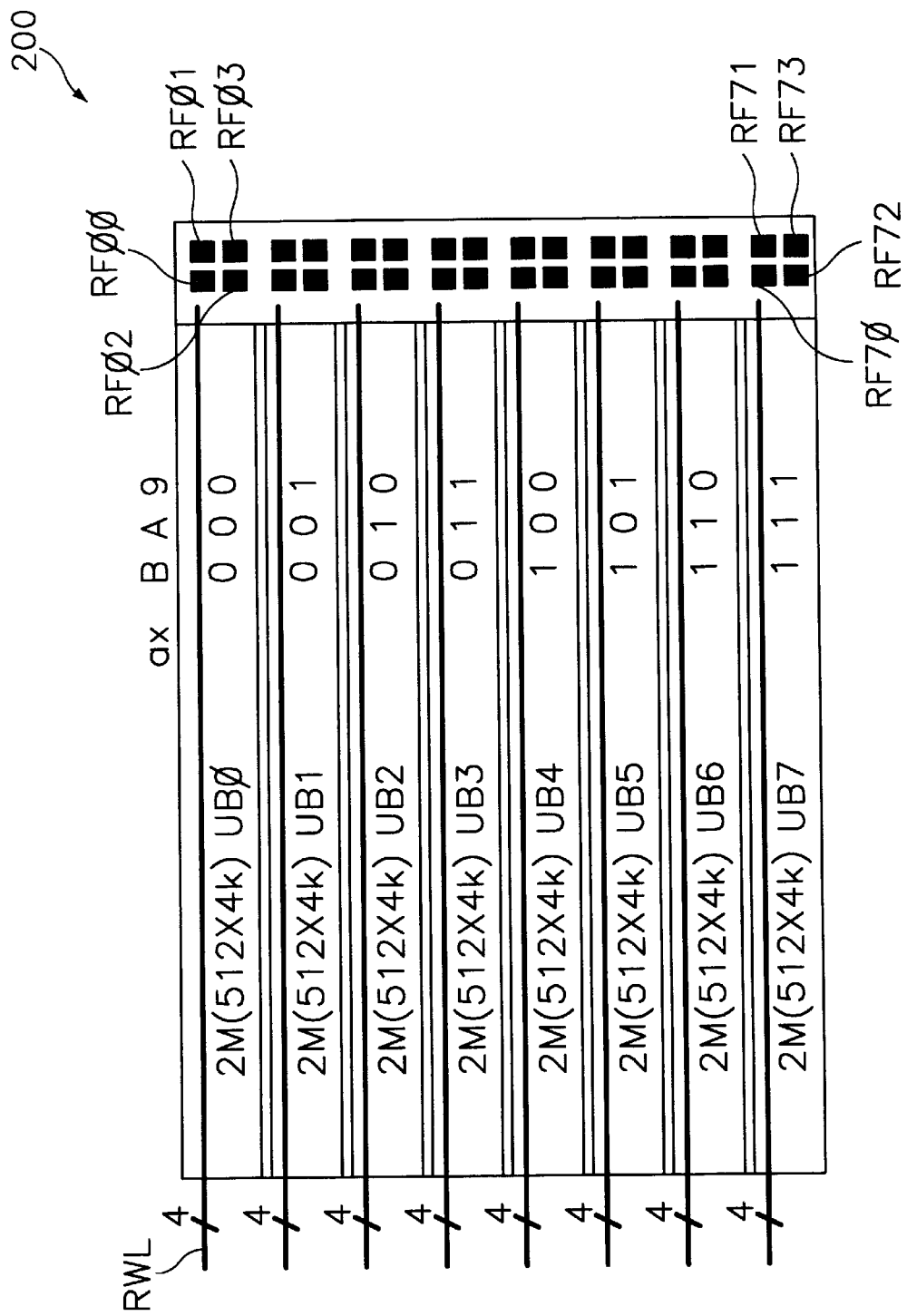
FIG. 2 is a block diagram showing a disposition of row repair fuse boxes in a memory bank according to a preferred embodiment of the invention.

FIG. 2 is a block diagram of a fuse summation circuit 200 showing a disposition of row repair fuse boxes in a memory bank according to a preferred embodiment of the invention. A memory bank (e.g., MB1) is composed of eight memory blocks UB0~UB7 each having a capacity of 2M (merely exemplary, other capacities can be used, as is true for each of the numerics in this example). Each memory block is constituted of 512 rows and 4K ($K=2^{10}=1024$), or, in other words, 512 wordlines and 4K bitlines, and assigned to four row repair fuse boxes (e.g., RF00~RF04 for UB0). The address for designating the eight memory blocks is composed of three address bits axB, axA, and ax9 (three bits can select eight blocks; $2^3=8$). The external address bit axB is the most significant bit (MSB).

Each memory block has row control logic blocks, and each row control logic block includes four row repair fuse boxes as aforementioned. That is, four row repair fuse boxes are associated with each memory block. Redundant wordlines RWLs are disposed in the memory blocks UB0~UB7 in the same number, each by four, which individually corresponds to the numerical arrangement of the row repair fuse boxes. Thus, the total number of the redundant wordlines is 32 (thirty-two) as much as the number of the row repair fuse boxes in a memory bank.

As each redundant wordline RWL corresponds to each fuse box, the row repair fuse boxes RF00~RF73 can drive the thirty-two redundant wordlines RWLs regardless of an order at a maximum of thirty-two normal wordlines that are defective in each bank. If a specific wordline is detected as being defective, the first one of the redundant wordlines located at the most right side is conductive in a repair operation.

With the redundancy constitution shown in FIG. 2 that is flexible within the 16M memory bank formed of 2M memory blocks, for instance, the four redundant wordlines arranged in the memory block UB0 are driven into a repair operation by means of the row repair fuse boxes RF00~RF04, and the other four redundant wordlines in the memory block UB1 are driven into a repair operation by means of their corresponding fuse boxes (e.g., RF10~RF14). As same as those manners, the redundant wordlines of each memory block can be taken in a repair operation till those of the eighth memory block UB7.

Figure 3A:
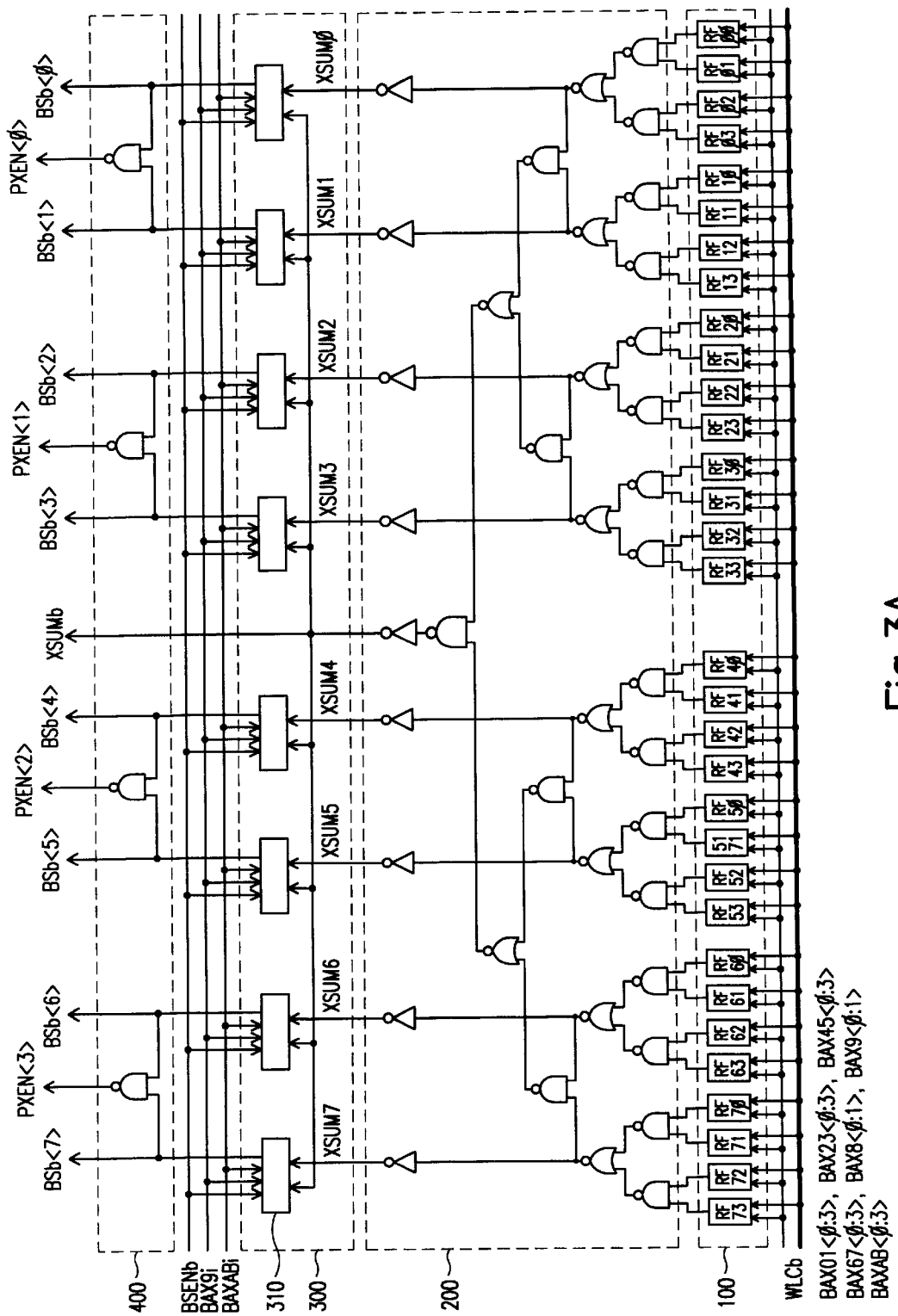
FIGS. 3A and 3B is a schematic diagram of circuits for performing a function of a row repair in a semiconductor memory device, including row repair fuse boxes and the peripherals thereof in accordance with the preferred embodiment of the invention.
Figure 3B:
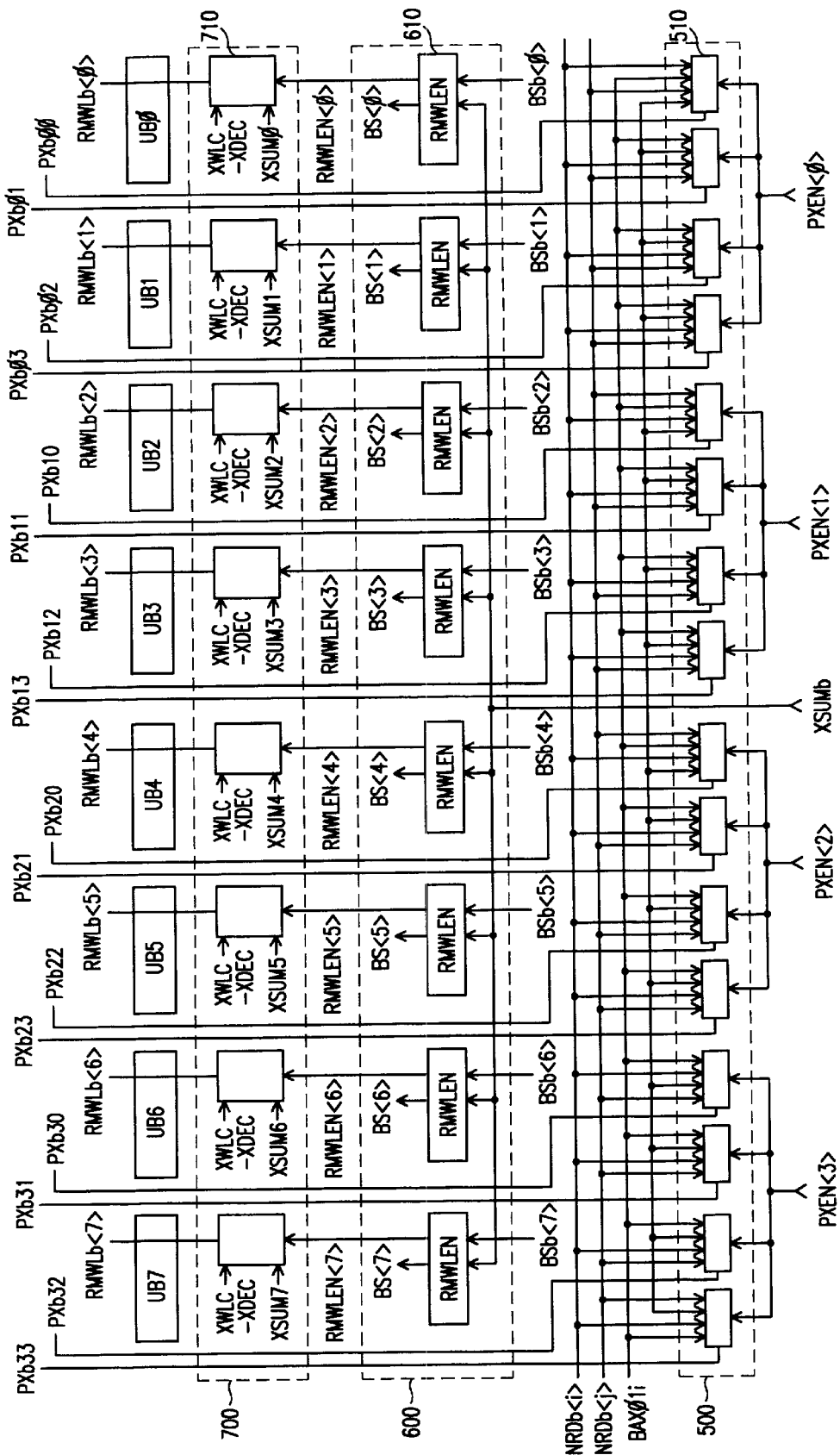

FIGS. 3A and 3B is a schematic diagram of circuits for performing a function of a row repair in a semiconductor memory device, including row repair fuse boxes and the peripherals thereof in accordance with the preferred embodiment of the invention. These figures show an embodied construction of row repair circuitry embodied in a semiconductor memory device only including the thirty-two row repair fuse boxes RF00~RF73 and the eight memory blocks UB0~UB7 (see FIG. 3B), which belong to a memory bank (e.g., MB0). It can be understood that the other construction of the row repair circuitry has the same constitution with that shown in FIGS. 3A and 3B.

The row repair circuitry of a memory bank is constructed of the eight memory blocks UB0~UB7, block 100 of the row repair fuse boxes RF00~RF73, fuse summation circuit 200, block selection circuit group 300, subwordline driver enable circuit 400, subwordline driver group 500, wordline enable signal generator group 600, and main wordline driver group 700.

The row repair fuse boxes RF00~RF73 in the block 100 receive row addresses BAX01<0:3>, BAX23<0:3>, BAX45<0:3>, BAX67<0:3>, and BAX8<0:1>, and block addresses BAX9<0:1> and BAXAB<0:3>, and then generate fuse decoding signals. The row and block addresses are generated from a pre-decoder (not shown).

The fuse summation circuit 200 combines the fuse decoding signals NRDb<0:32> with logic gates, and then generates summation signals XSUM<0:7>, repair information signal XSUMb. The block selection circuit group 300 includes eight block selection circuits 310s corresponding respectively with the eight memory blocks. The block selection circuits 310s receive the repair information signal XSUMb, the block selection addresses BAX9$i$ and BAXAB<$i$>, the summation signals XSUM<0:7>, and block selection enable signal BSENb, and then generate block selection signals BSb<0:7>. The subwordline driver enable circuit 400 inputs the block selection signal BSb<0:7> and then generates subwordline driver enable signal PXEN<0:3>.

The subwordline driver group 500 includes sixteen subwordline drivers 510s. The subwordline drivers 510s receives the subwordline driver enable signal PXEN<0:3>, pre-decoded row address signals BAX01$i$, the repair information signal XSUMb, and the fuse decoding signals NRDb<$i$> and NRDb<$j$>, and then generate subwordline drive signals PXb<00>~PXb<03>, PXb<10>~PXb<13>, PXb<20>~PXb<23>, and PXb<30>~PXb<33> to activate their corresponding wordlines.

The wordline enable signal generator group 600 includes wordline enable signal generators 610s which receive the block selection signals BSb<0:3> and the repair information signal XSUMb and then generate normal main wordline enable signals BS<0:7> and redundant main wordline enable signals RMWLEN<0:7>. The redundant main wordline drivers group 700 includes redundant main wordline drivers 710s which receives driver precharge signal WLC_XDEC, the summation signals XSUM<0:7>, and the redundant main wordline enable signals RMWLEN<0:7> and then generates redundant main wordline drive signals RMWLb<0:7>. The thirty-two redundant wordlines RWLs become conductive by decoding the subwordline drive signals PXb<00>~PXb<03>~PXb<10>~PXb<13>, PXb<20>~PXb<23>, and PXb<30>~PXb<33> and the redundant main wordline drive signals RMWLb<0:7>.

Figure 4:
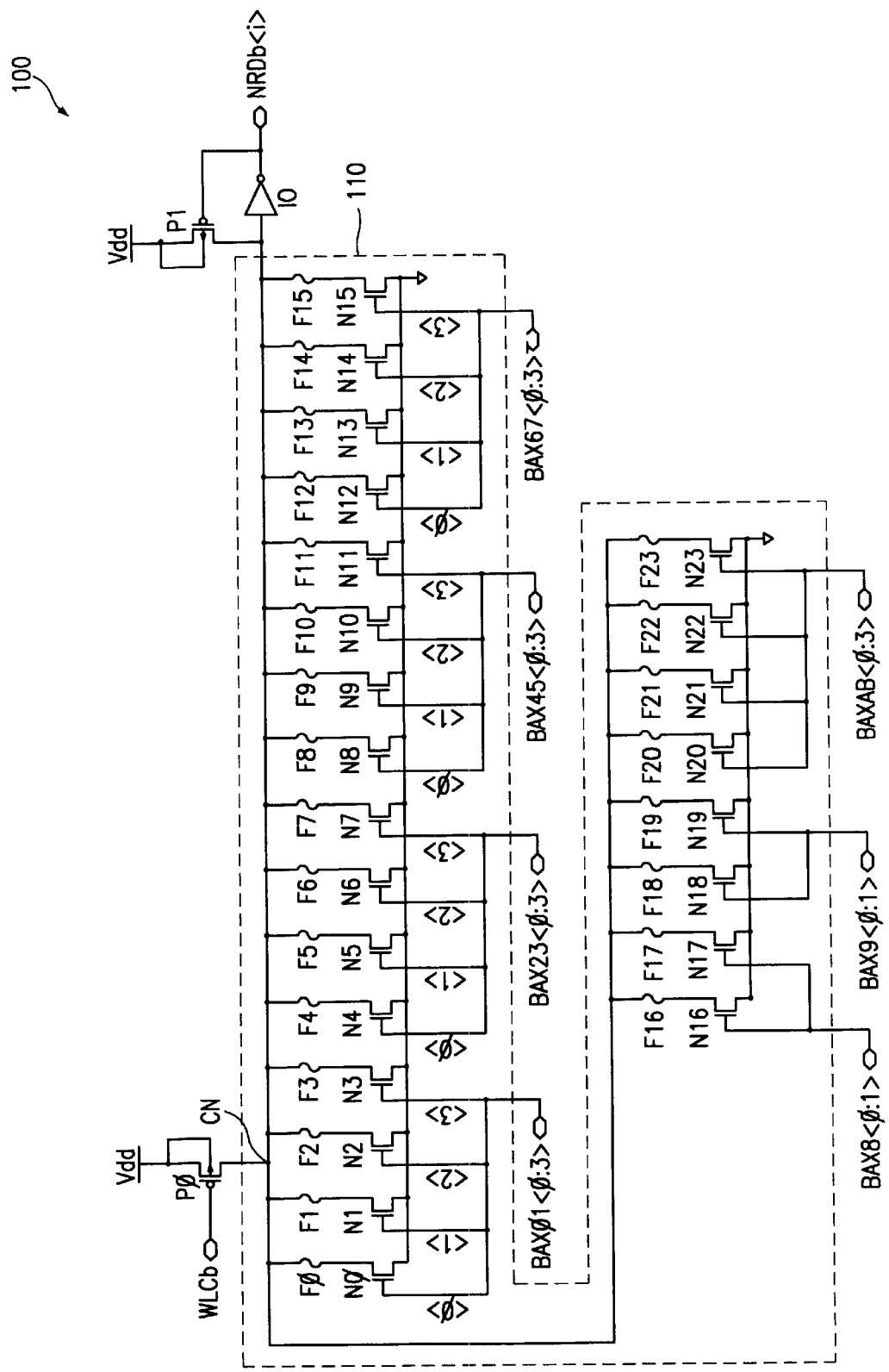
FIG. 4 is a circuit diagram of the row repair fuse box shown in FIG. 3A.

All of the fuse boxes have the same constructions. FIG. 4 is a circuit diagram of the row repair fuse box shown in FIG. 3A. The row repair fuse box (e.g., any one of RF00~RF73) includes fuse decoder 110 generating fuse decoding signal NRDb<$i$> ($i$ is one of 0~7) in response to a state at common node CN that is dependent upon parallel fusing loops responding to the pre-decoded row and block addresses, BAX01<0:3>~BAX8<0:1>, BAX9<0:1>, and BAXAB<0:3>. Also, the row repair fuse box includes PMOS transistor P0 connected between power supply voltage Vcc and the common node CN, inverter I0 reversing a logic state of the common node CN, and PMOS transistor P1 connected between the power supply voltage Vcc and the common node CN. Gates of the PMOS transistors, P0 and P1, are coupled to precharge signal WLCb and output of the inverter I0. The PMOS transistor P1 and the inverter I0 constitutes a latch circuit to hold a current signal level of the fuse decoding signal NRDb<$i$>.

The fuse decoder 110 is constructed of a plurality of fuses F0~F23 with their ends connected to the common node CN, and NMOS transistors N0~N23 connected between other ends of the fuses F0~F23 and substrate voltage Vss (or ground voltage). Gates of the NMOS transistors N0~N15 are coupled to the row address signals BAX01<0:3>, BAX23<0:3>, BAX45<0:3>, and BAX67<0:3>, by four in this order. Gates of the NMOS transistors N16 and N17 are coupled to row address signals BAX8<0:1>, respectively. Gates of the NMOS transistors N18 and Nl9 are coupled to block address signals BAX9<0:1>, and gates of the NMOS transistors N20~N23 are coupled to block address signals BAXAB<0:3>, respectively.

The precharge signal WLCb is a negative logic signal that is active with a low level to charge the common node CN by turning the PMOS transistor P0. The fuse decoding signal NRDb<i> goes to a low level when a repair operation needs to be carried out, while maintains a high level (i.e., a precharge level at SN1) when there is no occurrence of repairing. The pre-decoded row address signals BAX01<0:3>~BAX8<0:1> are internal address signals made by a pre-decoder which predecodes external address signals which are supplied into the semiconductor device in response to an activation of a row address strobe signal.

In an operation of the row repair fuse box shown in FIG. 4, first, the fuses F0~F23 are cut to be adaptable to the row address for defective wordlines after a test operation that detects defective wordlines. When the precharge signal WLCb is set on a low level, the PMOS transistor P0 is turned on and thereby the common node CN1 is charged up to high voltage level according to the power supply voltage Vcc. The PMOS transistor P1 and the inverter I0 hold the common node CN at the precharge voltage of a high level. In a row active state, as the precharge signal WLCb maintains a high level, the PMOS transistor P0 is turned off. And then, the common node maintains the high level when the row address signals BAX01<0:3>~BAX8<0:1>and the block address signals BAX9<0:1>and BAXAB<0:3>agree to those of a defective wordline, and thereby the fuse decoding signal NRDb<I> is established at a high level. On the contrary, when the row and block address signals different from those of the defective wordline makes the common node CN fall down to a low level, and thereby the fuse decoding signal NRDb<i> is established at a high level.

Figure 5:
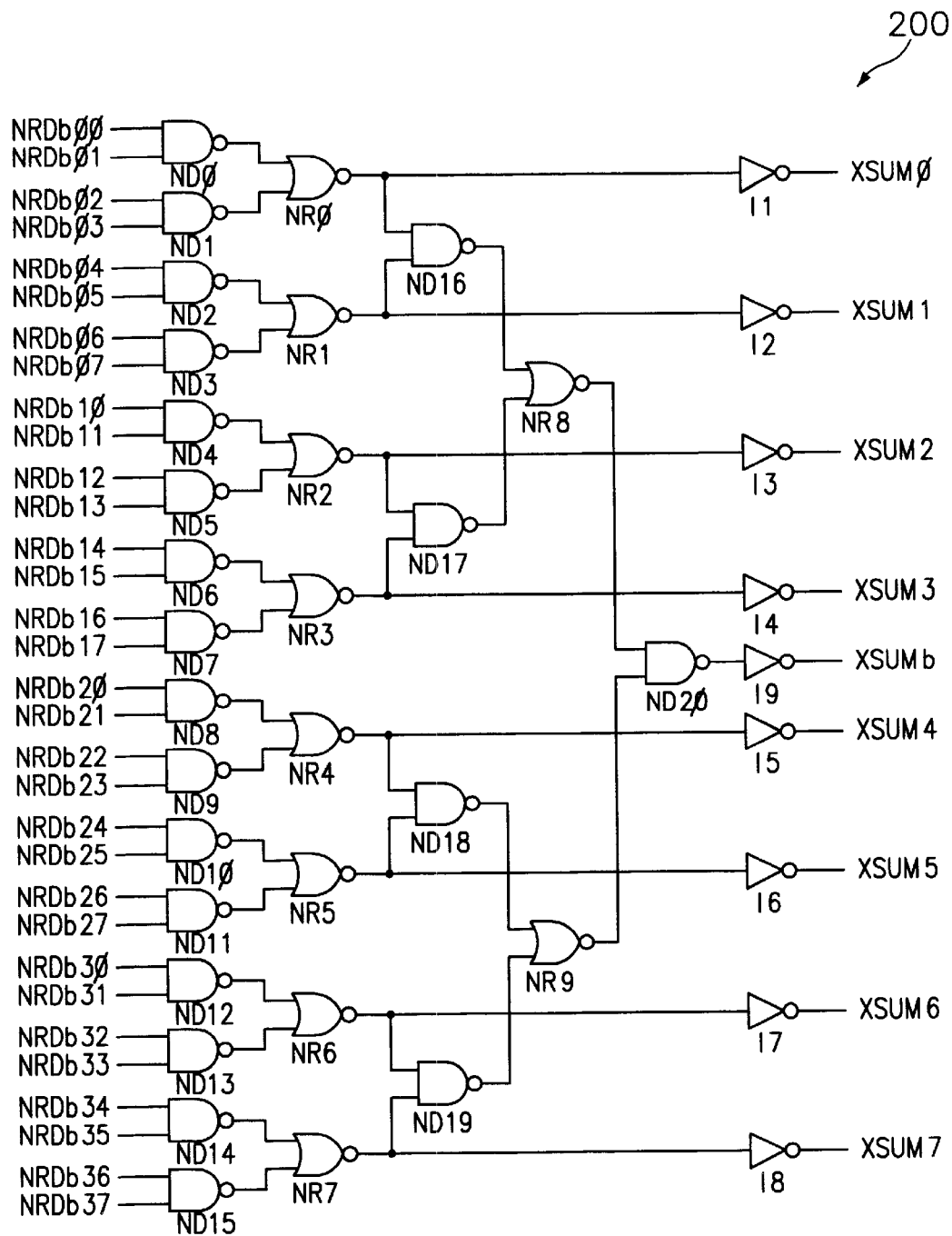
FIG. 5 is a circuit diagram of a fuse summation circuit shown in FIG. 3A.

FIG. 5 is a circuit diagram of a fuse summation circuit shown in FIG. 3A. The fuse summation circuit 200 combines the fuse decoding signals NRDb<0:32>into logic loops to make the summation signals XSUM<0:7>and the repair information signal XSUMb. The fuse summation circuit 200 is constructed of NAND gates ND0~ND20, NOR gates NR0~NR9, inverters I1~I8. The NAND gates ND0~ND15 receive the thirty-two fuse decoding signals NRDb<00>~NRDb<07>, NRDb<10>~NRDb<17>, NRDb<20>~NRDb<27>, and NRDb<30>~NRDb<37> generated from the fuse boxes RF00~RF73, by two. The NOR gates NR0~NR7 receive output signals from the NAND gates ND0~ND15 by two. The NAND gates ND16~ND19 receive output signals from the NOR gates NR0~NR7 by two. The NOR gates NR8 and NR9 receive output signals from the NAND gates ND16~ND19 by two. The NAND gate ND20 receives output signals from the NOR gates NR8 and NR9. The inverters I1~I8 converts the output signals of the NOR gates NR0~NR7 into the summation signals XSUM0~XSUM7, while the inverter I9 converts an output signal of the NAND gate ND20 into the repair information signal XSUMb.

Each summation signal (XSUM0-XSUM7) responds to either transition of four fuse decoding signals. For example, the summation signal XSUM<0> is made from logic combination with the four fuse decoding signals NRDb00~NRDb03 each generated from the four row repair fuse boxes RF00~RF03, and the summation signal XSUM<1> is made from logic combination with the four fuse decoding signals NRDb04~NRDb07 each generated from the four row repair fuse boxes RF20~RF23. The repair information signal XSUMb responds to either transition of the sixteen fuse decoding signals NRDb00~NRDb37. The summation signals XSUM<0:7>and the repair information signal XSUMb are used to set the block selection signals BSb<i>.

Figure 6:
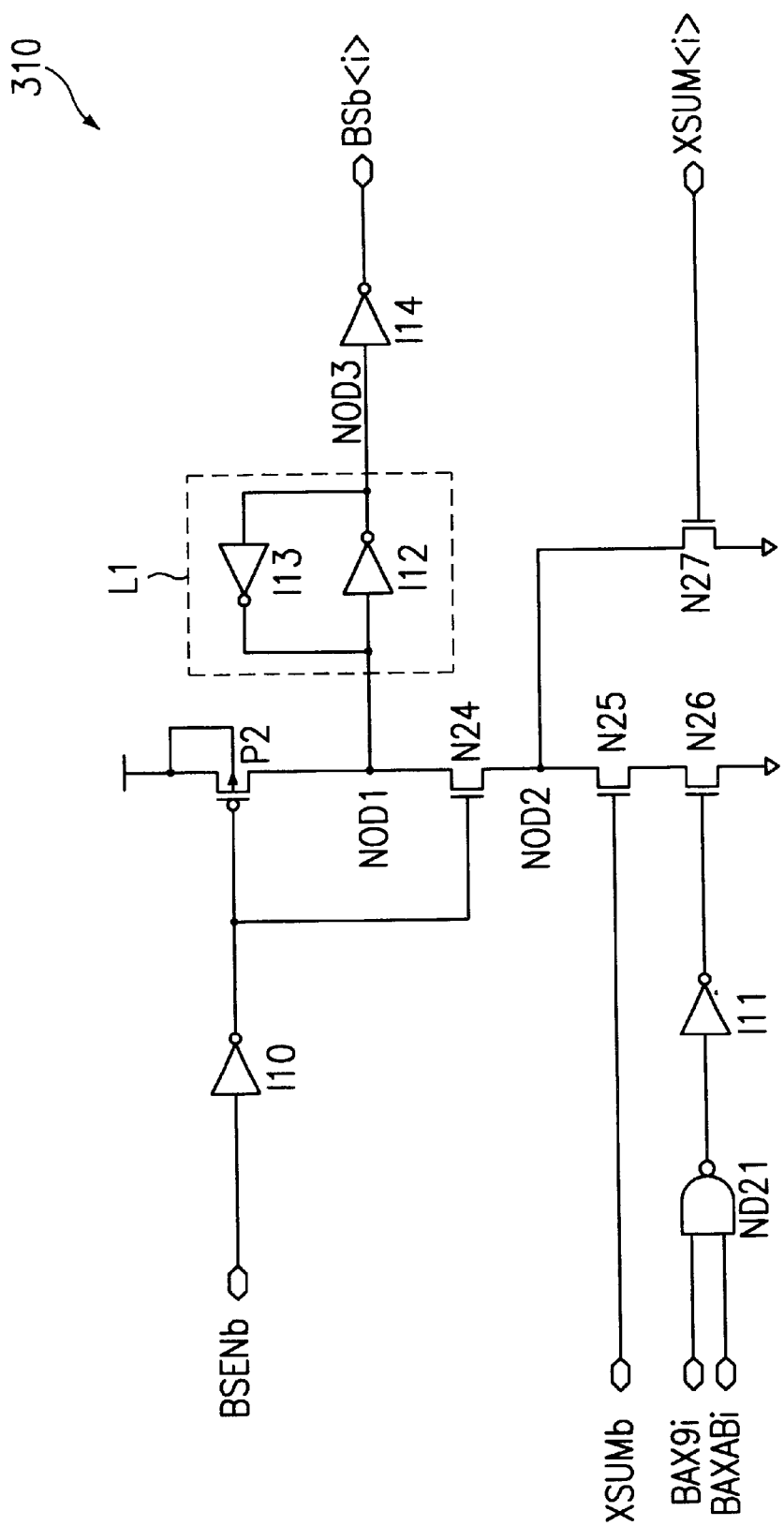
FIG. 6 is a circuit diagram of a block selection circuit shown in FIG. 3A.

FIG. 6 shows a circuit construction of the block selection circuit 310 included in the group 300. The block selection circuit(310) determines whether or not it receives the block address signals BAX9i and BAXABi from monitoring the summation result of the fuse decoding signals NRDb<i>.

The block selection operation in this embodiment is to select an alternative one among the eight memory blocks belonging to a memory bank by means of the pre-decoded block address signals BAX9i and BAXABi which are introduced in the memory device in response to the row activation where a row address strobe signal is enabled. The present embodiment employs the flexible row repair operation in which the memory block including the redundant wordlines is forced to be active whenever there is a presence of repair in the row repair fuse boxes.

The block selection circuit 310 shown in FIG. 6 activates a memory block corresponding to the block address signals BAX9i/BAXABi by using the repair information signal XSUMb of a high level when there is no need of repairing after monitoring the summation result of the fuse decoding signal NRDb<i>. On the other hand, if the repair information signal XSUMb is at a low level while the summation signal XSUM<i> (i=one of 0~7) corresponding thereto is at a high level when there is a repair, responding to a transition of the fuse decoding signal NRDb<i>, the summation signal XSUM<i> makes the selection circuit 310 not be influenced from the block address signals BAX9i/BAXABi and then activate the memory block (e.g., UB0) including the redundant wordlines.

The redundant block selection circuit 310 is constructed of inverter I10 converting the block selection enable signal BSENb into its reverse signal, PMOS transistor P2 connected between the power supply voltage terminal Vcc and node NOD1, NMOS transistor N24 connected between the nodes NOD1 and node NOD2, NMOS transistor N25 with its drain connected to the node NOD2, NMOS transistor N26 connected between the source of the NMOS transistor N25 and the ground voltage terminal, NAND gate ND21 receiving the block address signals BAX9i/BAXABi, inverter I11 converting an output signal of the NAND gate ND21 into its reverse signal, NMOS transistor N27 connected between the node NOD2 and the ground voltage terminal, latch circuit L1 formed of two inverters and connected between the node NOD1 and node NOD3, and inverter I14 converting an output signal of the latch circuit L1 into the block selection signal BSb<i>(i=one of 0~7). The gates of the PMOS and NMOS transistors, P2 and N24, are coupled to an output of the inverter I10. The gate of the NMOS transistor N25 is coupled to the repair information signal XSUMb, and the gate of the NMOS transistor N26 is coupled to an output of the inverter I11. the gate of the NMOS transistor N27 is coupled to XSUM<i>. The other block selection circuits including the group 300 have the same construction as shown in FIG. 6.

With respect to an operation in the block selection circuit 310, the block selection enable signal BSENb is set up to a low level when a corresponding memory bank is activated, while being a high level to precharge the block selection signal BSb<0> during a precharge mode.

In a normal active mode, the block selection enable signal BSENb of a low level turns the NMOS transistor N24 on. At this time, the repair information signal XSUMb and the block address signals BAX9i/BAXABi go up to high levels, so that the NMOS transistors N25 and N26 are turned on and thereby the block selection signal BSb<0> falls down to a low level. While, the summation signal XSUM<i> is at a low level to turn the NMOS transistor N27 off.

Next, in a repair mode, the repair information signal XSUMb is set on a low level to prevent an incoming of the block address signals BAX9i/BAXABi, and a high-level transition of the summation signal XSUM<i> causes the redundant block selection signal BSb<0> to be set on a low level.

Figure 7:
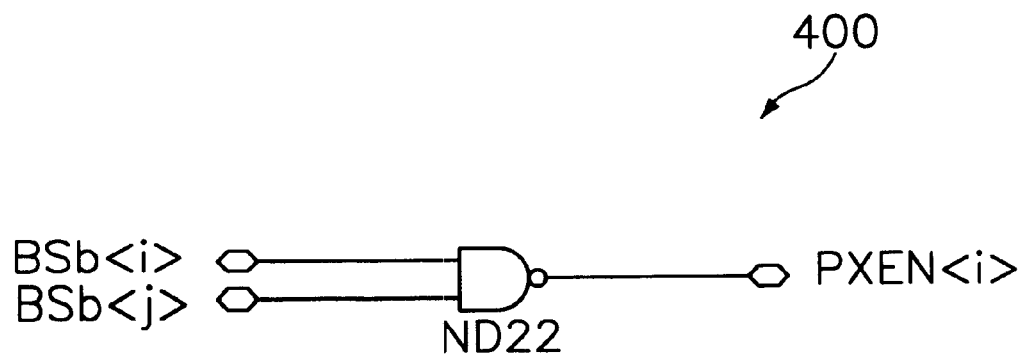
FIG. 7 is a circuit diagram of a subwordline driver enable circuit shown in FIG. 3A.

The subwordline driver enable circuit 400 shown in FIG. 3A includes NAND gates generating subwordline driver enable signals PXEN0~PXEN3. The unit of the subwordline driver enable circuit(400) is made of a NAND gate ND22, as shown in FIG. 7, which is in charge of four subwordline drivers shared by two adjacent memory blocks. Referring to FIG. 7, the NAND gate ND22 as the subwordline selection unit receives two block selection signals BSb<i> and BSb<j>, and then generates subwordline driver enable signal PXEN<i>(i=one of 0~3). The block selection address signals BSb<i> and BSb<j> are associated with different memory blocks from each other. Thus, if either BSb<i> or BSb<j> is active with a low level, the subwordline driver enable signal PXEN<i> goes up to a high level to turn the corresponding four subwordline drivers on.

Figure 8:
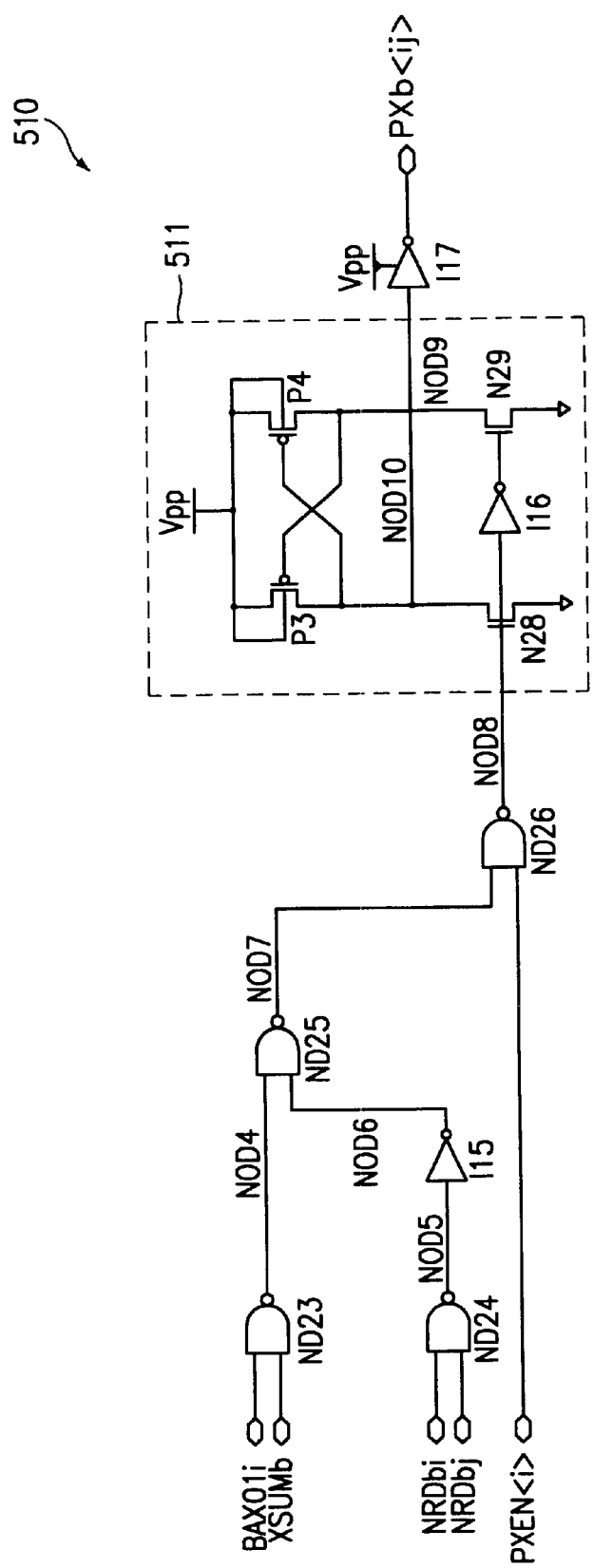
FIG. 8 is a circuit diagram of a subwordline driver shown in FIG. 3B.

FIG. 8 shows a circuit construction of the subwordline driver 510, which is included in the group 500, generating subwordline drive signal PXb<ij> in response to the fuse decoding signals NRDb<i> and NRDb<j>. The other subwordline drivers have the same construction as shown in FIG. 8.

The subwordline driver 510 is constructed of NAND gate ND23 receiving the pre-decoded row address signal BAX01i and the repair information signal XSUMb, NAND gate ND24 receiving the fuse decoding signals NRDb<i> and NRDb<j>, inverter I15 receiving an output signal of the NAND gate ND24, NAND gate ND25 receiving output signals of the NAND gate ND23 and the inverter I15, NAND gate ND26 receiving an output signal of the NAND gate ND25 and the subwordline driver selection signal PXEN<i>, level shifter 511 receiving an output of the NAND gate ND26, and inverter I17 converting an output signal of the level shifter 511 into the subwordline drive signal PXb<ij>. The level shifter 511 and the inverter I17 employ a high voltage (or a pumping voltage) Vpp as a power source voltage in order to enhance drivability of the wordlines. Voltage Vpp is higher than that of the power supply voltage.

As the subwordline drivers are shared by the two adjacent memory blocks, two subwordline drive signals are assigned to each memory block. For instance, the memory blocks UB0 and UB1 are associated with the subwordline drive signals PXb00, PXb01, PXb02, and PXb03, and the memory blocks UB6 and UB7 are associated with the subwordline drive signals PXb30, PXb31, PXb32, and PXb33.

The subwordline drive signal PXb<ij> is generated dependent upon the pre-decoded row address signal BAX01i or the fuse decoding signals NRDb<i> and NRDb<j> in accordance with a current operation mode. For example, the subwordline drive signal PXb<ij> responds to the row address signal BAX01i in a normal operation mode while to the fuse decoding signals NRDb<i> and NRDb<j> in a repair operation mode.

In the repair operation mode, the coding mechanisms for the sixteen subwordline drive signals PX<ij> (PXb<00>~PXb<33>) generated from the subwordline drivers 510s are figured out as follows, corresponding to the row repair fuse boxes shown in FIG. 3A each by each:

NRDb00/NRDb04→PXb<00>, NRDb01/NRDb05→PXb<01>

NRDb02/NRDb06→PXb<02>, NRDb03/NRDb07→PXb<03>

NRDb10/NRDb14→PXb<10>, NRDb11/NRDb15→PXb<11>

NRDb12/NRDb16→PXb<12>, NRDb13/NRDb17→PXb<13>

NRDb20/NRDb24→PXb<20>, NRDb21/NRDb25→PXb<21>

NRDb22/NRDb26→PXb<22>, NRDb23/NRDb27→PXb<23>

NRDb30/NRDb34→PXb<30>, NRDb31/NRDb35→PXb<31>

NRDb32/NRDb36→PXb<32>, NRDb33/NRDb37→PXb<33>

Each subwordline drive signal PXb<ij> responds to each pre-decoded row address signal BAX01i in a normal operation mode. Each subwordline subword-line drive signal PXb<ij> responds to each pair of the coded fuse decoding signals NRDb<i> and NRDb<j> in a repair operation mode because the repair information signal XSUMb of a low level prohibits an entrance of the row address signal BAX01i. The subwordline driver enable signal PXEN<i> goes up to a high level when the block selection signal BSb<i> is enabled.

Now, it will be explained about a more detail procedure for generating the subwordline drive signal PXb<ij>.

First, in the normal operation mode, as the repair information signal XSUMb is at a high level, the output signal from the NAND gate ND23 becomes a low level in response to the pre-decoded row address signal BAX01i. At this time, according to the fuse decoding signals NRDb<i> and NRDb<j> of high levels, the output signal of the inverter I15 is set on a high level to make a signal path through node NOD4 be exclusively effective to the output signal of the NAND gate ND25 that is at a high level. When the subwordline driver enable signal PXEN<i> maintains a high level, the NAND gate ND26 applies a low-leveled output signal thereof to the level shifter 511 in response to the high-leveled output signal from the NAND gate ND25 and PXEN<i> of a high level. The level shifter 511 pulls a voltage level up to the high voltage Vpp at output node NOD10 in response to the output signal of a low level from the NAND gate ND26. Thereby, the subwordline drive signal PXb<ij> is established on a low level through the inverter I17.

In the repair operation mode, as the repair information signal XSUMb is at a low level to set the node NOD4 on normally a high level, the output signal of the NAND gate ND25 completely responds to the fuse decoding signals NRDb<i> and NRDb<j> regardless of the row address signal BAX01i. When one of the fuse decoding signals NRDb<i> and NRDb<j> falls down to a low level, the nodes NOD5, NOD6, and NOD7 are at high, low, and high levels, in sequence. As a result, the high-leveled NOD7 and PXEN<i> makes the node NOD8 become a low level, and thereby, as is in the normal mode, the subwordline drive signal PXb<ij> is set on a low level.

A plurality of the subwordline drive signals PXb<ij> are used to operate the thirty-two redundant wordlines together with the redundant main wordline drive signals RMWLb<i>.

Figure 9:
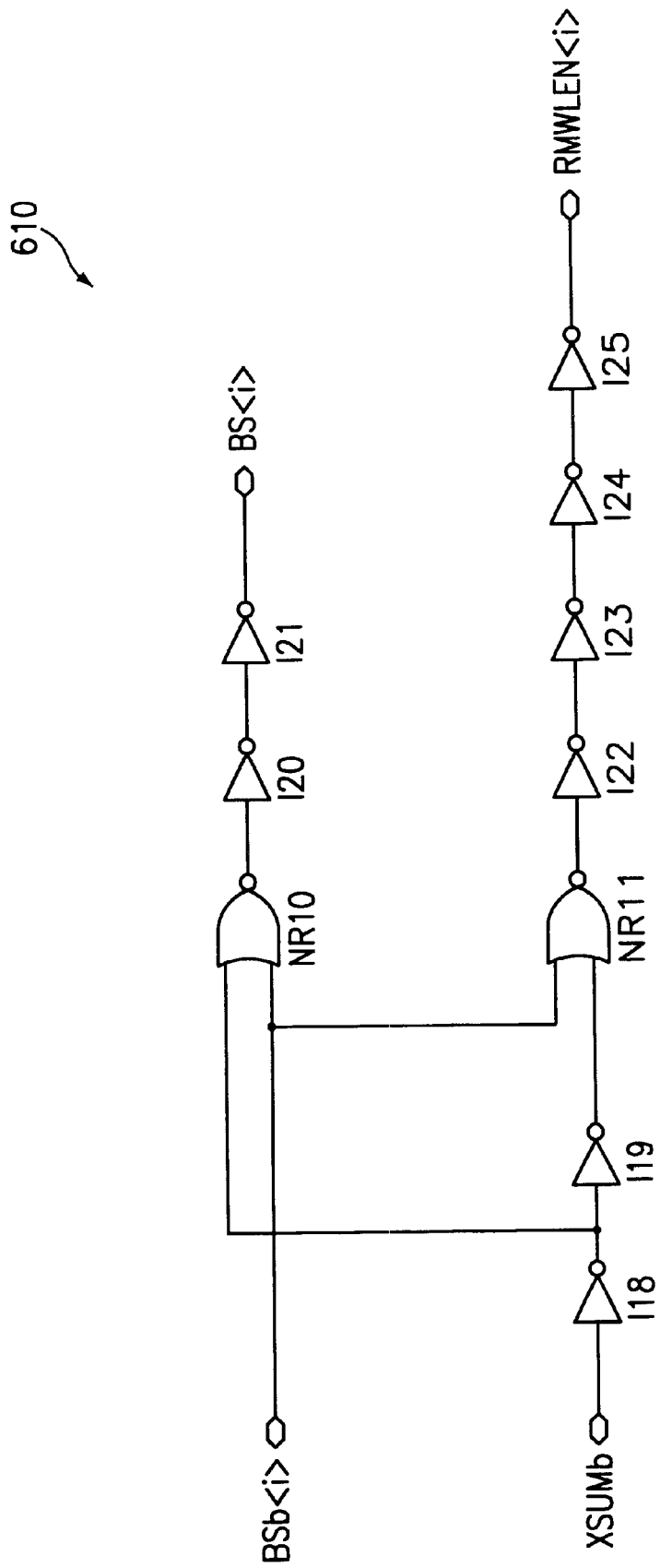
FIG. 9 is a circuit diagram of a wordline enable signal generator shown in FIG. 3B.

The wordline enable signal generator group 600 shown in FIG. 3B includes redundant main wordline enable signal generator 610. Referring to FIG. 9, the redundant main wordline enable signal generator 610 is constructed of inverter I18 converting the repair information signal XSUMb into its reverse signal, NOR gate NR10 receiving the block selection signal BSb<i> and the output signal of the inverter I18, inverter I19 reversing the output signal from the inverter I18, NOR gate NR11 receiving the block selection signal BSb<i> and an output signal of the inverter I19, serially connected inverters I20 and I21 converting an output signal of the NOR gate NR10 into the normal main wordline enable signal BS<i>, and serially connected inverters I22~I25 converting an output signal of the NOR gate NR11 into the redundant main wordline enable signal RMWLEN<i>.

It can be understood that the redundant main wordline enable signal RMWLEN and the normal main wordline enable signal BS<i> are made by responding to the repair information signal XSUMb and the block selection signal BSb<i> that is assigned to a memory block (one of the memory blocks UB0~UB7) including the redundant wordlines RWLs. The redundant main wordline enable signals RMWLEN<i> and the normal main wordline enable signals BS<i> activate the redundant main wordline drivers and a main decoder (not shown), respectively.

With respect to an operation in the redundant main wordline enable signal generator 610, during a normal operation mode where there is no occurrence of repairing, as the block selection signal BSb<i> is at a low level and the repair information signal XSUMb is at a high level, the normal main wordline enable signal BS<i> is enabled with a high level to make the X-decoder (i.e., row decoder) be active while the redundant main wordline enable signal RMWLEN<i> is disabled with a low level. During a repair operation mode, the repair information signal XSUMb is set on a low level, and thereby the normal main wordline enable signal BS<i> is disabled off with a low level while the redundant main wordline enable signal RMWLEN<i> is enabled with a high level.

Figure 10:
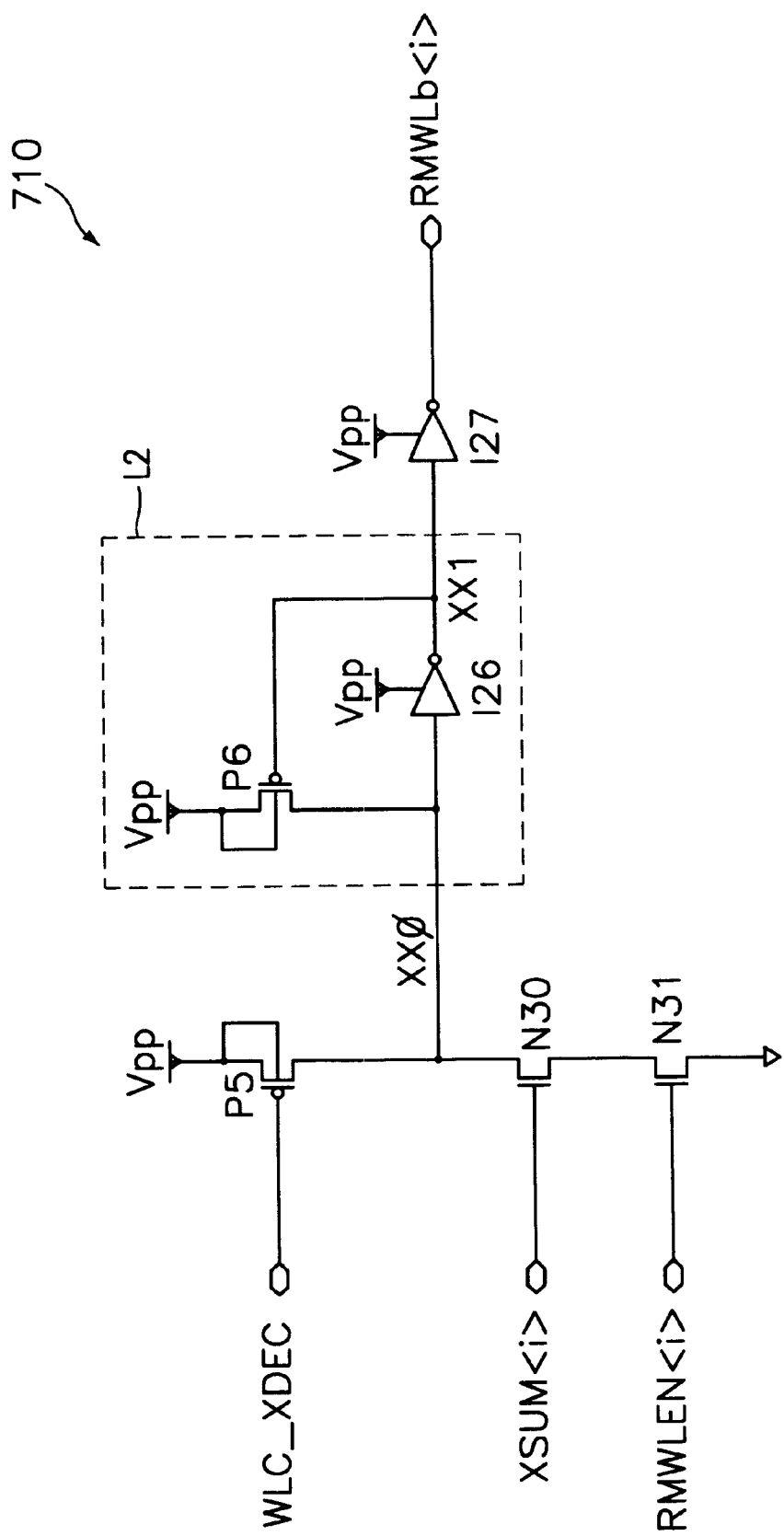
FIG. 10 is a circuit diagram of a redundant main wordline driver shown in FIG. 3B.

FIG. 10 shows a circuit construction of the redundant main wordline driver 710, which is included in the group 700, to control the redundant wordline RWL that is enabled by decoding the redundant main wordline drive signal RMWLb<i> and the subwordline drive signal PXb<ij>. The redundant main wordline driver 710 is constructed of PMOS transistor P5 connected between the high voltage Vpp and node XX0, NMOS transistors N30 and N31 which are connected between the node XX0 and the ground voltage terminal in series, PMOS transistor P6 connected between Vpp and the node XXO, inverter I26 connected between the drain and gate of the PMOS transistor P6, and inverter I27 converting the output signal of the inverter I26 into the redundant main wordline drive signal RMWLb<i>. The PMOS transistor P6 and the inverter I26 forms latch circuit L2 to hold a current state at the node XX0 therein. The gate of the PMOS transistor P5 is coupled to precharge signal WLC_XDEC. The gates of the NMOS transistors N30 and N31 are coupled to the summation signal XSUM<i> and the redundant main wordline enable signal RMWLEN<i>, respectively. The gate of the PMOS transistor P6 is coupled to node XX1 disposed between the inverters I26 and I27.

The precharge signal WLC_XDEC is provided to the driver 710 in order to charge the node XXO up to a predetermined voltage level in advance, and is also applied to a main X-decoder (not shown). When the precharge signal WLC_XDEC is at a low level, the nodes XXO is charged up to a high level and thereby the redundant main wordline drive signal RMWLb<i> is pre-set on a high level.

During a repair operation mode, as the redundant main wordline enable signal RMWLEN<i> is at a high level, the NMOS transistor N31 is turned on and thereby the redundant main wordline drive signal RMWLb<i> is enabled.

A plurality of the redundant main wordline drive signals RMWLb<i> are employed to operate the thirty-two redundant wordlines RWLs which are separately arranged in the eight memory blocks by As seen through the drawings and the description aforementioned, the row repair circuitry of present invention provides advanced repair constitutions to be able to enhance efficiency of a repair operation. The memory block including the redundant wordlines is conductive whenever there is a need of repairing, regardless of a location of a memory block having a defective wordline (or a defective memory cell). Such enhancement of the repair efficiency with flexible substitution architecture makes the product yield of semiconductor memory devices be increased, and also contributes to reduce the cost per chip (or the cost per bit) and to ensure a competitive price of a semiconductor memory device in a market.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A semiconductor memory device having a function of row repair, comprising;
    a plurality of memory blocks each including the predetermined number of redundant wordlines;
    a plurality of row repair fuse boxes arranged so that the same number of fuse boxes is in each memory block, the number of the row repair fuse boxes being identical to the number of the redundant wordlines; and
    repair means to replace defective wordlines with the redundant wordlines, wherein the repair means is configured to replace the defective wordline of one memory block with the redundant wordline of other memory blocks, by using not only output signals from the plurality of row repair fuse boxes but also block address signals.

2. The semiconductor memory device of claim 1, wherein the row repair fuse boxes generate fuse decoding signals in response to row address signals, block address signals, and precharge signal.

3. The semiconductor memory device of claim 2, wherein the row repair fuse box comprises:
    a fuse decoding circuit for generating the fuse decoding signal in response to the row address signals and the block address signals;
    a switch for connecting a power supply voltage to the fuse decoding circuit in response to the precharge signal; and
    a latch circuit for holding a current voltage level of the fuse decoding signal.

4. The semiconductor memory device of claim 3, wherein the fuse decoding circuit comprises:
    a plurality of fuses connected to a sensing node that is commonly connected to the switch and an input of the latch circuit; and
    a plurality of switches connected between the fuses and a ground voltage and its gate coupled to the row address signals and the block address signals.

5. The semiconductor memory device of claim 1, wherein the repair means comprises:
    a fuse summation circuit for generating summation signals and a repair information signal in response to fuse decoding signals supplied from the row repair fuse boxes;

a plurality of block selection circuits for generating block selection signals in response to the summation signals, the repair information signal, the block address signals, and block selection enable signals;

a plurality of subwordline driver enable circuits for generating subwordline driver enable signals in response to the block selection signals;

a plurality of subwordline drivers for generating subwordline drive signals in response to the subwordline driver selection signals, a part of the row address signals, the fuse decoding signals, and the repair information signal;

a plurality of wordline enable signal generators for creating redundant main wordline enable signals and normal main wordline enable signals in response to the repair information signal and the block selection signals; and a plurality of redundant main wordline drivers for generating redundant main wordline drive signals in response to the summation signals, the redundant main wordline enable signals, and a precharge signal;

wherein the redundant wordlines are driven by decoding the subwordline drive signals from the subwordline drivers and the redundant main wordline drive signals from the redundant main wordline drivers.

6. The semiconductor memory device of claim 5, wherein the fuse summation circuit comprises:

a plurality of first logic elements for receiving the fuse decoding signal;

a plurality of second logic elements for receiving output signals of the first logic elements;

a plurality of third logic elements for receiving output signals of the second logic elements;

a plurality of fourth logic elements for receiving output signals of the third logic elements;

a fifth logic element for receiving output signals of the fourth logic elements;

a plurality of first inverting elements for converting output signals of the second logic elements into a plurality of the summation signals; and a second inverting elements for converting an output signal of the fifth logic element into the repair information signal.

7. The semiconductor memory device of claim 5, wherein the block selection circuit, includes means for, after checking whether or not there has been a repair, enabling the memory block having the redundant wordlines when there has been a presence of repair while receiving an address assigned to each memory block when there has been an absence of repair.

8. The semiconductor memory device of claim 5, wherein the block selection circuit comprises:

a first inverting element for receiving the block selection enable signal;

a first switching element for connecting a power supply voltage to a first node in response to an output signal of the first inverting element;

a second switching element for connecting the first node to a second node in response to the output signal of the first inverting element;

a latch circuit connected between the first node and a third node;

a second inverting element for converting an output signal of the latch circuit into the block selection signal;

a third switching element for connecting the second node to a ground voltage in response to the repair information signal;

a logic element for receiving the block address signals;

a third inverting element for receiving an output signal of the logic element;

a fourth switching element for connecting the third switching element to the ground voltage in response to an output signal of the third inverting element; and a fifth switching element for connecting the second node to the ground voltage in response to the summation signal.

9. The semiconductor memory device of claim 5, wherein the subwordline driver enable circuit comprises a logic element for receiving the block selection signals and for generating a subwordline driver enable signal.

10. The semiconductor memory device of claim 5, wherein the subwordline drivers comprises:

a first logic element for receiving a part of the row address signals and the repair information signal;

a second logic element for receiving the fuse decoding signals;

a first inverting element for receiving an output signal of the second logic element;

a third logic element for receiving output signals from the first logic element and the first inverting element;

a fourth logic element for receiving an output signal of the third logic element and the subwordline driver enable signal;

a level shifter for receiving an output signal of the fourth logic element; and a second inverting element for converting an output signal from the level shifter into the subwordline drive signal.

11. The semiconductor memory device of claim 5, wherein the wordline enable signal generator comprises:

a first inverting element for receiving the repair information signal;

a first logic element for receiving the block selection signal and an output signal from the first inverting element;

a plurality of second inverting elements for converting an output signal of the first logic element;

a third inverting element for receiving the output signal from the first inverting element;

a second logic element for receiving the block selection signal and an output signal of the third inverting element; and a plurality of fourth inverting elements for converting an output signal of the second logic element into the redundant main wordline enable signal.

12. The semiconductor memory device of claim 5, wherein the redundant main wordline driver comprises:

a first switching element for connecting a high voltage to a first node in response to the precharge signal;

a second switching element for connecting the first node to a ground voltage in response to the summation signal;

a third switching element for connecting the second switching element to the ground voltage in response to the redundant main wordline enable signal;

a first inverting element connected between the first node and a second node;

a fourth switching element for connecting the high voltage to the first node in response to an output signal of the first inverting element; and a second inverting element for converting the output signal of the first inverting element into the redundant main wordline drive signal.

* * * * *